(12) United States Patent
Drewes

(10) Patent No.: US 7,063,985 B2
(45) Date of Patent: Jun. 20, 2006

(54) METHOD FOR FABRICATING SENSOR DEVICES HAVING IMPROVED SWITCHING PROPERTIES

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/768,678

(22) Filed: Feb. 2, 2004

(65) Prior Publication Data

US 2004/0150059 A1  Aug. 5, 2004

Related U.S. Application Data

(62) Division of application No. 10/132,447, filed on Apr. 26, 2002, now Pat. No. 6,689,622.

(51) Int. Cl.
*H01L 21/02* (2006.01)
(52) U.S. Cl. .......................................... 438/3
(58) Field of Classification Search ............... 257/108, 257/421, 422, 426, E21.665, 427; 438/3, 438/22; 365/171; 360/324.2, 324.12
See application file for complete search history.

(56) References Cited

U.S. PATENT DOCUMENTS

| | | | |
|---|---|---|---|
| 6,163,477 A | 12/2000 | Tran | |
| 6,282,069 B1 * | 8/2001 | Nakazawa et al. | 360/324.2 |
| 6,341,053 B1 * | 1/2002 | Nakada et al. | 360/324.2 |
| 6,351,410 B1 | 2/2002 | Nakao et al. | |
| 6,418,048 B1 * | 7/2002 | Sin et al. | 365/173 |
| 6,542,341 B1 * | 4/2003 | Carey et al. | 360/324 |
| 6,655,006 B1 * | 12/2003 | Pinarbasi | 29/603.07 |
| 6,700,760 B1 * | 3/2004 | Mao | 360/324.2 |
| 2002/0154455 A1 * | 10/2002 | Lenssen | 360/324 |

OTHER PUBLICATIONS

"Magnetic Tunnel Junction Materials for Electronic Applications", Slaughter et al. JOM0e, 52 (6) (2000. Jun. 2000. http://www.tms.org/pubs/journals/JOM/0006/Slaughter/Slaughter-0006.html (visited Oct. 3, 2002).

* cited by examiner

*Primary Examiner*—Laura M. Schillinger
*Assistant Examiner*—Jennifer M Dolan
(74) *Attorney, Agent, or Firm*—Dickstein Shapiro Morin & Oshinsky LLP

(57) ABSTRACT

The invention provides an magnetic memory element having improved switching properties and zero field offset, and a manufacturing method thereof. The element comprises a first magnetic layer overlying a conductive layer and a nonmagnetic layer overlying the first magnetic layer. Next, a second magnetic layer is provided over the nonmagnetic layer, wherein the second magnetic layer comprises an antiferromagnetic layer overlying a ferromagnetic free layer to apply a small bias to the ferromagnetic free layer. Then, the first magnetic, nonmagnetic and second magnetic layers are patterned to form the memory element.

18 Claims, 13 Drawing Sheets

METHOD FOR FABRICATING SENSOR DEVICES HAVING IMPROVED SWITCHING PROPERTIES

CROSS-REFERENCE TO RELATED APPLICATIONS

This application is a division of U.S. patent application Ser. No. 10/132,447, filed Apr. 26, 2002 now U.S. Pat. No. 6,689,622 and is related to U.S. patent application Ser. No. 10/633,628, now U.S. Pat. No. 6,927,466.

FIELD OF INVENTION

The invention relates to a magnetic memory element and a fabricating method thereof, and more particularly to a magnetic random access memory (MRAM) element having improved switching and switching field offset properties.

BACKGROUND OF THE INVENTION

A magnetic random access memory (MRAM) is a non-volatile memory which uses multiple layers of magnetoresistive materials as memory storage elements. A typical MRAM array includes a number of conductive bit or digit lines intersected by conductive word lines. At each intersection, a magnetoresistive element, commonly referred to as a magnetic tunnel junction (MTJ) memory element is formed. Each magnetic memory element includes a first pinned ferromagnetic material layer (where the magnetic field is fixed) and a second free ferromagnetic material layer (where the magnetic field can, by programming, assume two different orientations). The two ferromagnetic layers are separated by a nonmagnetic layer. The direction of the magnetic vectors in the free and pinned layers, determines the stored state of the magnetic memory element. As such, the magnetic memory element has two stable magnetic states. In one magnetic direction of the free layer, the memory element has a high resistance defined as one logic value, e.g. "0," and in the other magnetic direction of the free layer the memory element has a low resistance, defined as the other logic value, e.g. "1." The stored state of the memory element is generally read by providing a sense current through the magnetic memory element to determine its resistance.

FIG. 1 illustrates an exemplary conventional MRAM structure including three magnetic memory elements 22, having respective associated conductive lines 18,28 which may serve as word lines and bit lines. Conductive lines 18, typically formed of copper, are formed in an insulating layer 16 formed over under-layers 14 of an integrated circuit (IC) substrate 10. Under-layers 14 may include, for example portions of integrated circuitry, such as CMOS circuitry. A pinned layer 20 is provided over the conductive lines 18. A nonmagnetic layer 24 is provided over the pinned layer 20. The nonmagnetic layer 24 is generally formed of aluminum oxide. A free layer 26 is provided over the nonmagnetic layer 24. Another conductive line 28 is formed over the free layer 26.

Switching of the memory elements 22 are not always reliable. Sometimes, the combined magnetic write fields applied by the word and bit lines might not cause a memory element 22 to switch reliably. This problem is typically solved by increasing crystal anisotropy, coercivity or aspect ratio of the memory elements.

However, increasing the crystal anisotropy, coercivity or aspect ratio leads to another problem: the amount of current for switching the memory elements is also increased. Increasing the amount of current increases the amount of power consumed by the MRAM device and also requires larger bit lines, word lines and write circuits to handle the higher currents. This, in turn, increases the expense of the MRAM device.

A need exists to improve reliability of magnetic memory element switching without increasing the switching current.

SUMMARY OF THE INVENTION

The invention provides a magnetic memory element having improved switching and offset, and a manufacturing method thereof. In an exemplary embodiment of the invention, a first conductor in a trench is provided in an insulating layer. An upper surface of the insulating layer and the first conductor are planarized. Then, a pinning structure is formed over the first conductor and the insulating layer. Then, a nonmagnetic layer and a ferromagnetic free layer are consecutively formed over the pinning structure. Next, an antiferromagnetic layer is formed over the ferromagnetic free layer to apply a small bias to the ferromagnetic free layer without causing it to be pinned. The bias allows the ferromagnetic free layer to be centered near the zero magnetic switching field more easily, thus allowing improved repeatability in switching. In a preferred embodiment of the invention, the antiferromagnetic layer is no thicker than about 70 Angstroms. The layers are then patterned into magnetic memory elements.

The above advantages and features of the invention will be more clearly understood from the following detailed description which is provided in connection with the accompanying drawings.

DETAILED DESCRIPTION OF THE INVENTION

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium-arsenide. When reference is made to substrate in the following description, previous process steps may have been utilized to form regions or junctions in or on the base semiconductor or foundation.

Figure 1:
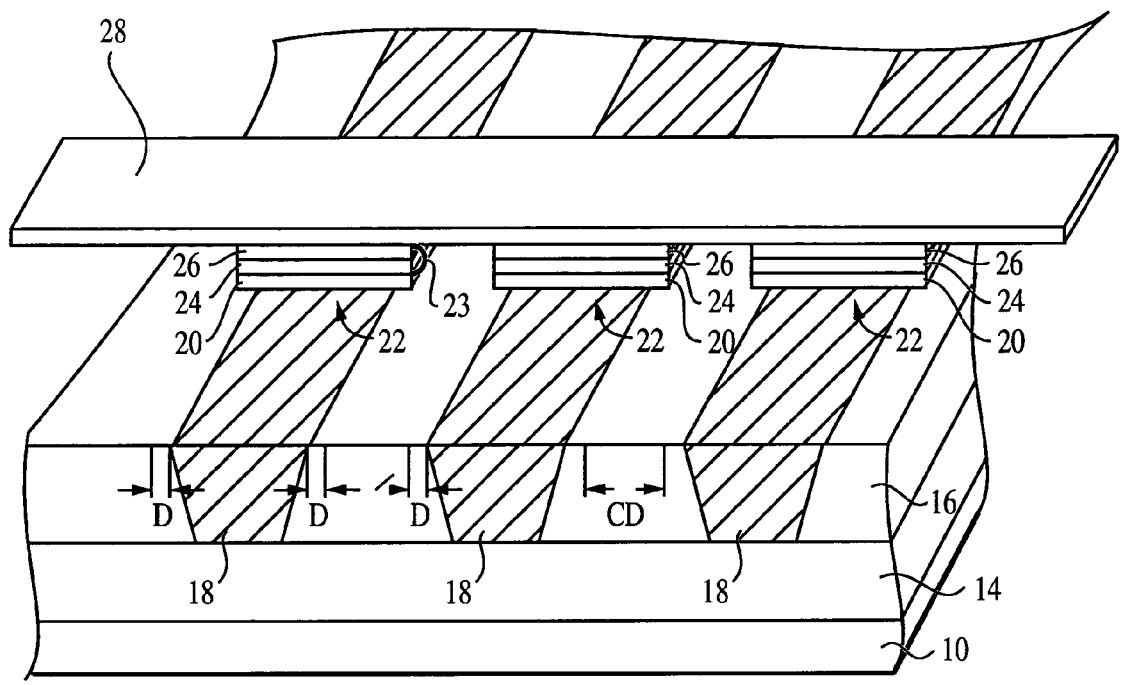
FIG. 1 is a schematic three-dimensional view of a portion of a conventional MRAM structure.
Figure 2:
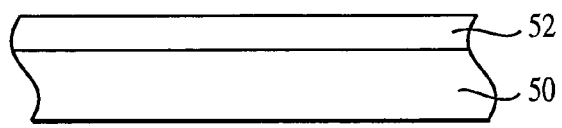
FIG. 2 illustrates a partial cross-sectional view of a semiconductor topography, at an intermediate stage of the processing, wherein a magnetic memory element will be constructed in accordance with the invention.

Referring now to the drawings, where like elements are designated by like reference numerals, FIGS. 2–20 illustrate an exemplary embodiment of a method of forming a magnetic memory element according to the invention. FIG. 2 depicts a portion of a semiconductor substrate 50 on which an underlying layer 52 has been already formed according to well-known methods of the prior art. The underlying layer 52 may include, for example, integrated circuit layers forming CMOS devices and circuits which are used to operate an MRAM device containing many memory elements.

Figure 3:
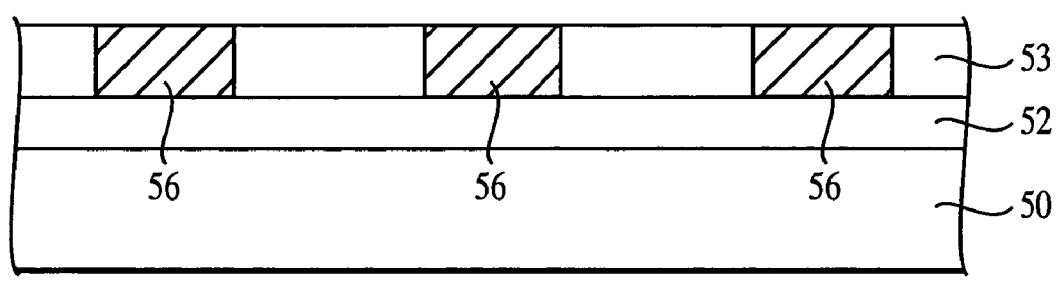
FIG. 3 illustrates a partial cross-sectional view of the magnetic memory element at a stage of processing subsequent to that shown in FIG. 2.

Referring now to FIG. 3, a first insulating layer 53 is formed over the substrate 50 and the underlying layer 52. Conductive vias 56 are formed within first the insulating layer 53 for connection with circuit components fabricated within underlying layer 52.

Figure 4:
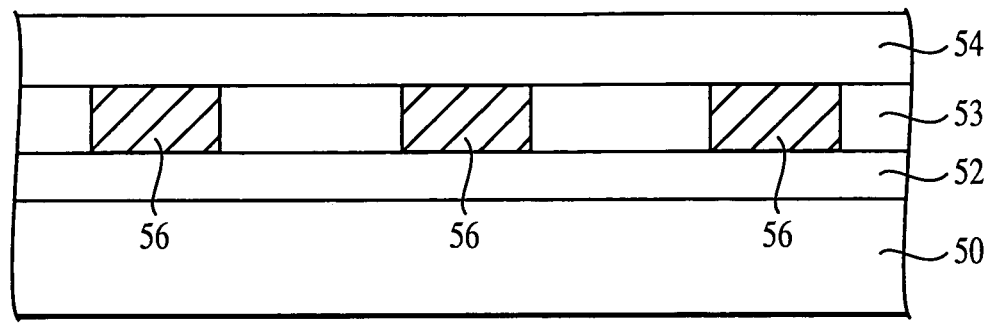
FIG. 4 illustrates a partial cross-sectional view of the magnetic memory element at a stage of processing subsequent to that shown in FIG. 3.

Referring now to FIG. 4, a second insulating layer 54 is formed over the first insulating layer 53 and the conductive vias 56. In an exemplary embodiment of the invention, the insulating layers 53 and 54 are blanket deposited by plasma enhanced chemical vapor deposition (PECVD)to a thickness of about 1,000 Angstroms to about 10,000 Angstroms. However, other known deposition methods, such as sputtering by chemical vapor deposition (CVD), spin coating, or physical vapor deposition (PVD), may be used also in accordance with the desired characteristics of the underlying layer 52. The insulating layers 53 and 54 may be formed of a conventional insulator, for example, a thermal oxide of silicon, such as SiO or $SiO_2$, or a nitride, such as $Si_3N_4$, or BPSG. Alternatively, a high temperature polymer, such as a polyimide, or a low dielectric constant inorganic material may also be employed.

Figure 5:
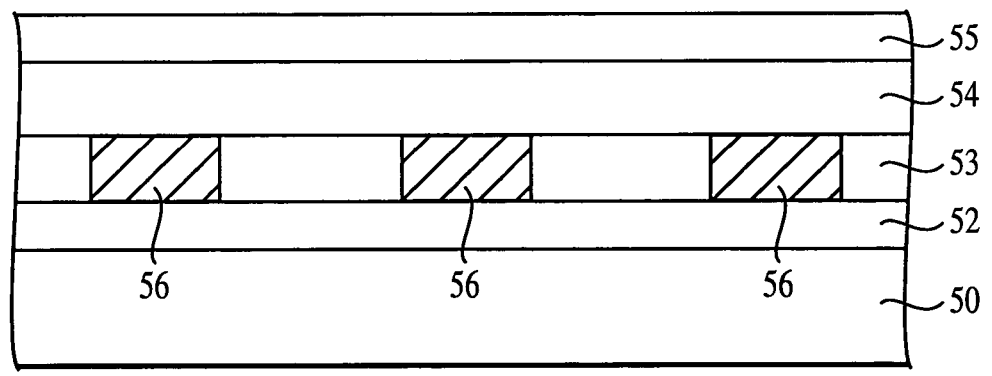
FIG. 5 illustrates a partial cross-sectional view of the magnetic memory element at a stage of processing subsequent to that shown in FIG. 4.

Next, as illustrated in FIG. 5, a photoresist layer 55 is formed over the insulating layer 54. The photoresist layer 55 is exposed through a mask 56 (FIG. 6) with high-intensity UV light. The mask 56 may include any suitable pattern of opaque and clear regions that may depend, for example, on the desired pattern to be formed in the insulating layer 54. This way, portions 55a of the photoresist layer 55 are exposed through portions 56a of the mask 56 wherever portions of the insulating layer 54 need to be removed.

Figure 6:
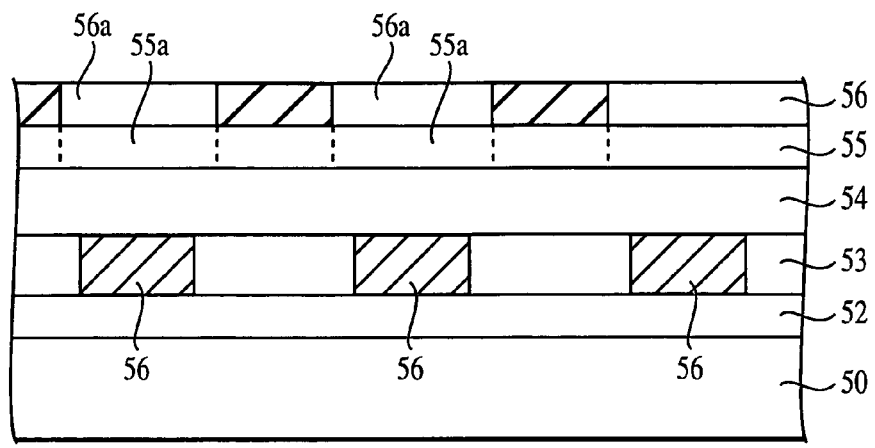
FIG. 6 illustrates a partial cross-sectional view of the magnetic memory element at a stage of processing subsequent to that shown in FIG. 5.
Figure 7:
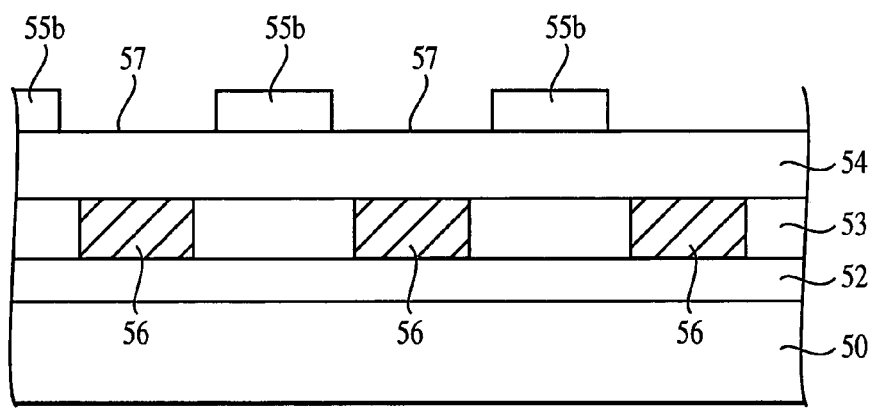
FIG. 7 illustrates a partial cross-sectional view of the magnetic memory element at a stage of processing subsequent to that shown in FIG. 6.

Although FIG. 6 schematically illustrates mask 56 positioned over the photoresist layer 55, those skilled in the art will appreciate that mask 56 is typically spaced from the photoresist layer 55 and light passing through mask 56 is focussed onto the photoresist layer 55. After exposure and development of the exposed portions 55a, portions 55b of the unexposed and undeveloped photoresist layer 55 are left over the insulating layer 54, as shown in FIG. 7. This way, openings 57 (FIG. 7) are formed in the photoresist layer 55.

Figure 8:
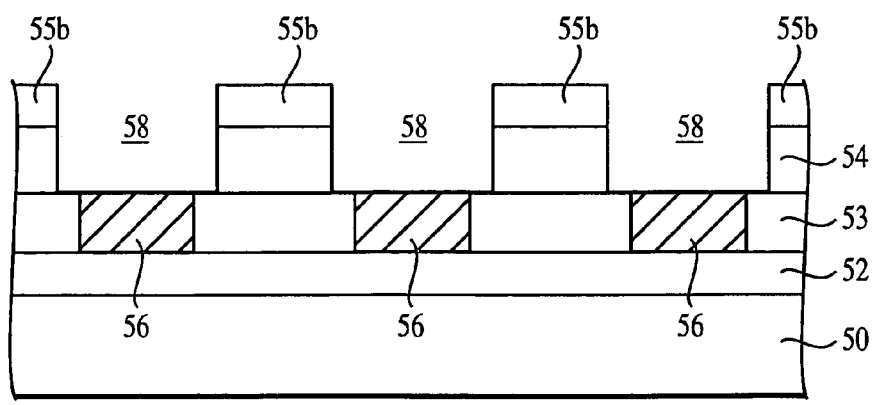
FIG. 8 illustrates a partial cross-sectional view of the magnetic memory element at a stage of processing subsequent to that shown in FIG. 7.
Figure 9:
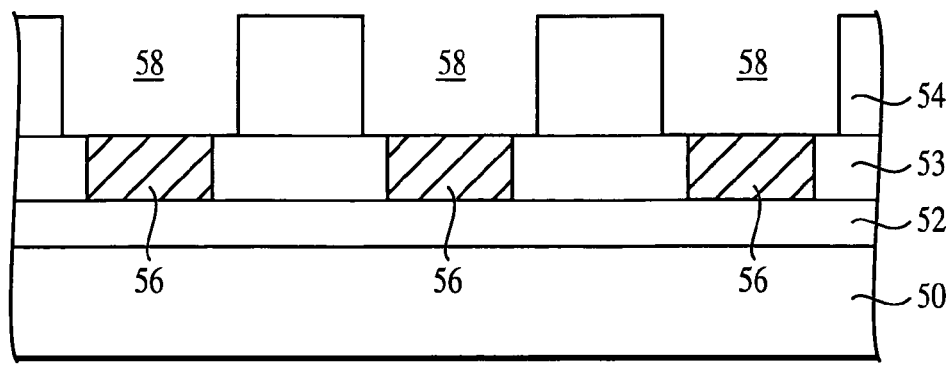
FIG. 9 illustrates a partial cross-sectional view of the magnetic memory element at a stage of processing subsequent to that shown in FIG. 8.

An etch step is next performed to obtain grooves 58 in the insulating layer 54, as illustrated in FIGS. 8–9. The grooves 58 are etched to a depth of about 500 Angstroms to about 2,000 Angstroms, more preferably of about 1,000 Angstroms. Subsequent to the formation of the grooves 58, the remaining portions 55b of the positive photoresist layer 55 are then removed by chemicals, such as hot acetone or methylethylketone, or by flooding the substrate 50 with UV irradiation to degrade the remaining portions 55b to obtain the structure of FIG. 8.

Figure 10:
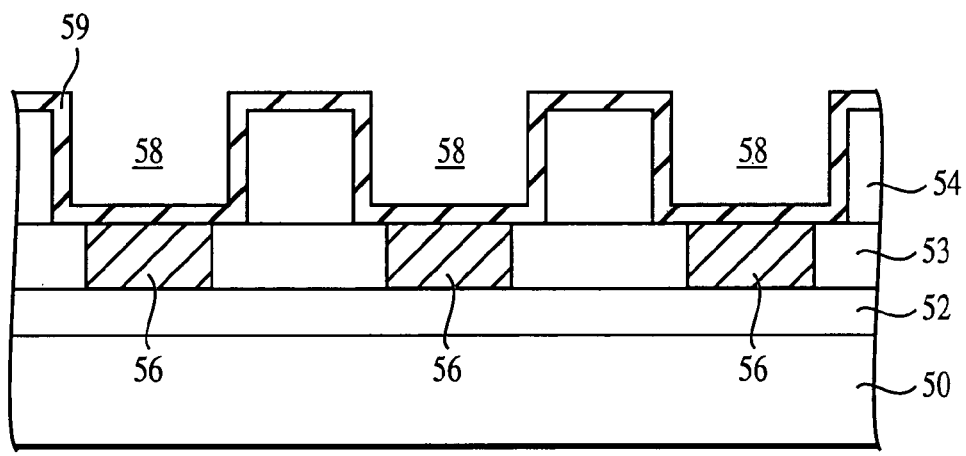
FIG. 10 illustrates a partial cross-sectional view of the magnetic memory element at a stage of processing subsequent to that shown in FIG. 9.

Subsequent to the formation of the grooves 58 (FIGS. 8–9), a thin barrier layer 59 is formed in the grooves 58 and over the insulating layer 54, as shown in FIG. 10. The barrier layer 59 may comprise bonding materials such as tantalum (Ta), titanium (Ti), titanium-tungsten (TiW), titanium-nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum. In this embodiment, tantalum is deposited to a thickness of about 5 nm to about 10 nm. This layer may also be comprised of a ferromagnetic material deposited on the barrier or in place of the barrier for the purpose of field focusing.

Figure 11:
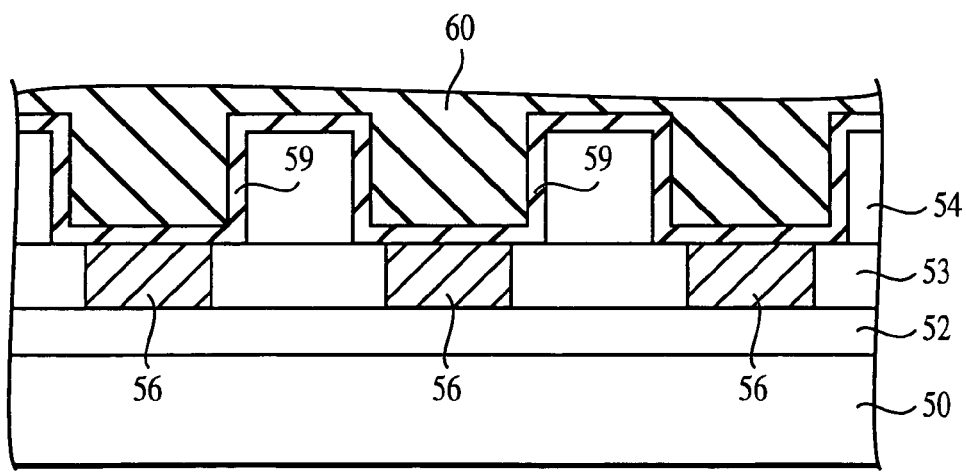
FIG. 11 illustrates a partial cross-sectional view of the magnetic memory element at a stage of processing subsequent to that shown in FIG. 10.

Next, as illustrated in FIG. 11, a conductive material layer 60 is formed over the barrier layer 59 and the insulating layer 54 to fill in the grooves 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 12:
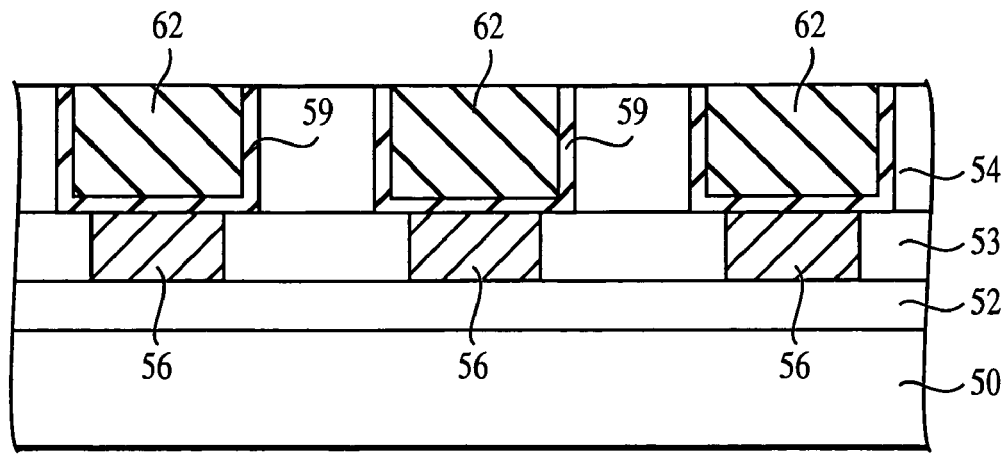
FIG. 12 illustrates a partial cross-sectional view of the magnetic memory element at a stage of processing subsequent to that shown in FIG. 11.

The conductive material layer 60 is formed over the barrier layer 59 by deposition, for example, and then excess material is removed to form metal lines 62 (FIG. 12). In an exemplary embodiment of the invention, the excess conductive material layer 60 is removed via CMP. The top surfaces of the barrier layer 59 and the metal lines 62 are generally flat and uniform across the entire surface of the substrate, as shown in FIG. 12. Each metal line 62 will form the bit or digit line of a conventional magnetic memory element.

Next, the processing steps for the completion of the magnetic memory elements 100 are now carried out. A pinning structure 79 is formed over the metal lines 62. The pinning structure 79 may comprise at least one magnetic layer and may further comprise one or more nonmagnetic layers. The pinning structure 79 may be formed of various material layers, described below in more detail, which are successively deposited over the metal lines 62.

Figure 13:
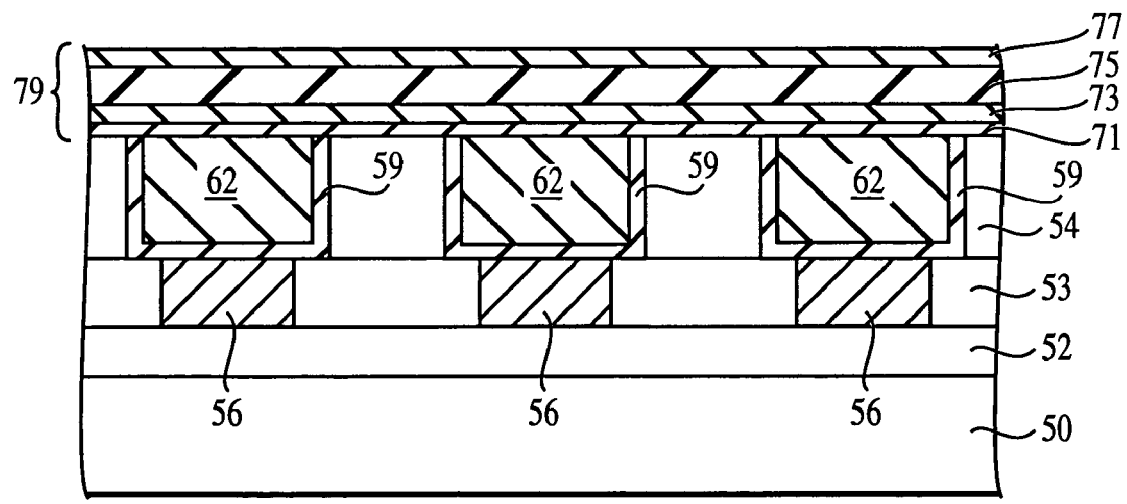
FIG. 13 illustrates a partial cross-sectional view of the magnetic memory element at a stage of processing subsequent to that shown in FIG. 12.

In an exemplary embodiment of the invention as illustrated in FIG. 13, a first tantalum (Ta) layer 71 (of about 20–400 Angstroms thick, more preferably of about 50 Angstroms thick), a nickel-iron (NiFe) seed layer 73 (of about 10–100 Angstroms thick, more preferably of about 60 Angstroms thick), a manganese-iron (MnFe) anti-ferromagnetic layer 75 (of about 10–100 Angstroms thick, more preferably of about 100 Angstroms thick) and a nickel-iron (NiFe) pinned layer 77 (of about 10–100 Angstroms thick, more preferably of about 60 Angstroms thick) are successively blanket deposited over the substrate to form the pinning structure 79. Deposition of the layers 71, 73, 75 and 77 may be accomplished by magnetron sputtering, for example. However, other conventional deposition methods may also be used, as desired.

Figure 14:
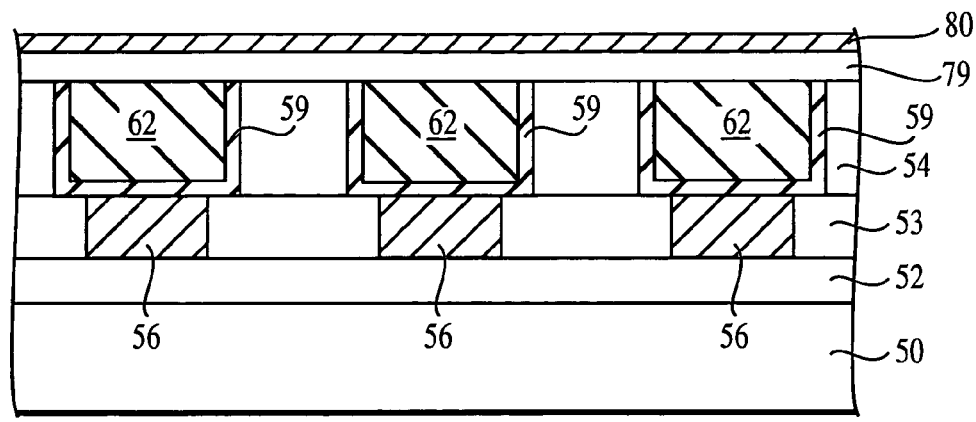
FIG. 14 illustrates a partial cross-sectional view of the magnetic memory element at a stage of processing subsequent to that shown in FIG. 13.

Following the deposition of the layers 71, 73, 75 and 77, a nonmagnetic, electrically nonconductive layer 80 formed of, for example, aluminum oxide ($Al_2O_3$) (of about 5–25 Angstroms thick, more preferably of about 15 Angstroms thick) is next formed overlying the pinning structure 79, as shown in FIG. 14. Although aluminum oxide is the preferred material, it must be understood that the invention is not limited to its use, and other non-magnetic materials, such as copper (Cu), titanium-oxide ($TiO_2$), magnesium-oxide (MgO), silicon oxide ($SiO_2$) or aluminum-nitride (AlN), may be used also.

Figure 15:
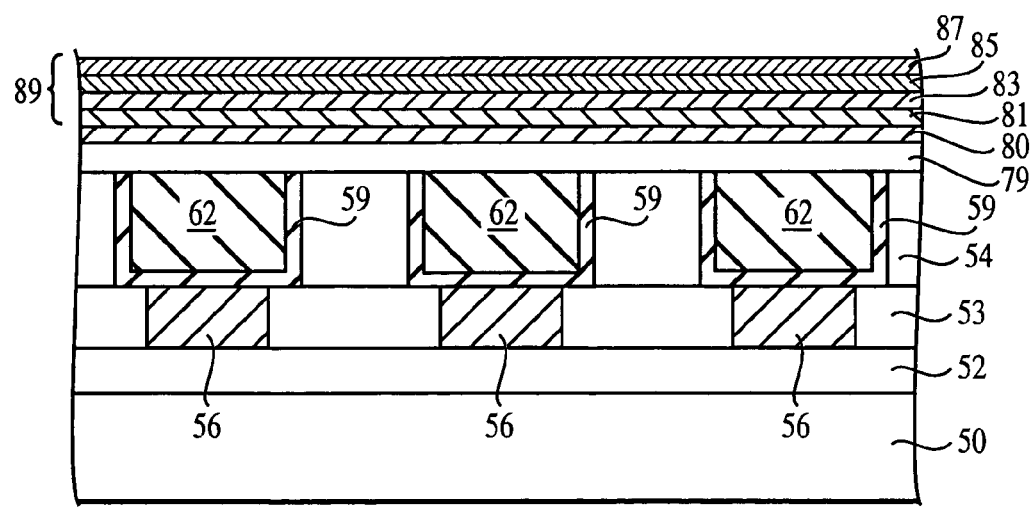
FIG. 15 illustrates a partial cross-sectional view of the magnetic memory element at a stage of processing subsequent to that shown in FIG. 14.

Referring now to FIG. 15, a sensing structure 89 is deposited over the nonmagnetic layer 80. The sensing structure 89, like the pinning structure 79, may also comprise a plurality of layers. The layers may be formed of various material layers, which are successively deposited over the nonmagnetic layer 80.

Figure 20:
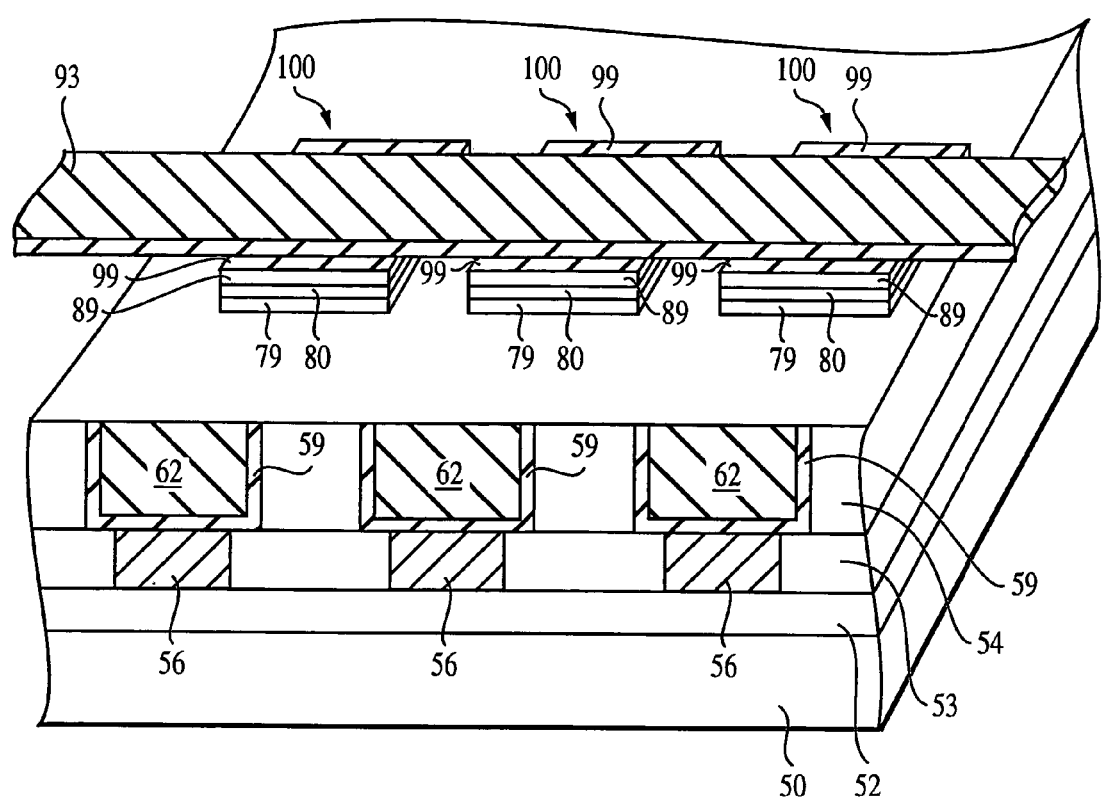
FIG. 20 is a partial three-dimensional view of the magnetic memory element at a stage of processing subsequent to that shown in FIG. 19.

Accordingly, in an exemplary embodiment of the invention, a nickel-iron (NiFe) free layer 81 (of about 10–100 Angstroms thick, more preferably of about 40 Angstroms thick), an antiferromagnetic layer 83 (preferably less than 70 Angstroms thick), a tantalum cap layer 85 (of about 10–100 Angstroms thick, more preferably of about 50 Angstroms thick), and a conductive layer 87 (of about 100–400 Angstroms thick, more preferably of about 200–300 Angstroms thick) are successively blanket deposited over the nonmagnetic layer 80, to form the sensing structure 89, as shown in FIG. 15. Deposition of the layers 81, 83, 85 and 87 may be accomplished by magnetron sputtering, for example, but other conventional deposition methods may be used also, depending on the characteristics of the IC devices constructed prior to the formation of the magnetic memory elements 100 (FIG. 20).

In an exemplary embodiment of the invention, the antiferromagnetic layer 83 may be formed of IrMn, FeMn, NiMn, PtMn, NiO, CoNiO and synthetic layers comprised of two ferromagnetic layers separated by a metal, for example, Ruthenium. The antiferromagnetic layer 83 is used to apply a small bias to the ferromagnetic free layer 81 of sensing structure 89 without causing the sensing structure to be pinned in a particular orientation. In other words, by applying a bias with the antiferromagnetic layer 83, the sensing structure 89 can more easily be centered about the zero magnetic field. Any bias which allows the exchange field between the antiferromagnetic layer 83 and the ferromagnetic free layer 81 to be less than the shape dependent coercivity of the device is acceptable. Also, the slight bias applied by the antiferromagnetic layer 83 stabilizes the ferromagnetic free layer 81, thus allowing the sensing structure 89 and memory element as a whole to exhibit improved repeatability in switching. Also, in a preferred embodiment of the invention, the antiferromagnetic layer 83 has a thickness less than about 70 Angstroms. This allows the ferromagnetic free layer to be magnetized in a direction defined by a field applied with either a nearby current through a line or an external field.

The conductive layer 87 may be formed of tungsten-nitrogen (WN), which is deposited to a thickness of about 100–400 Angstroms, more preferably of about 200–300 Angstroms. However, the invention is not limited to this exemplary embodiment, this layer may be comprised of a resistive material such as WN, TaN, WsiN, and others. This layer may act as a series resistor and or a CMP stopping layer dependent on the material and thickness chosen. Materials such as amorphous carbon, various oxides, and nitrides may be used as CMP stops as well as series resistors.

Figure 16:
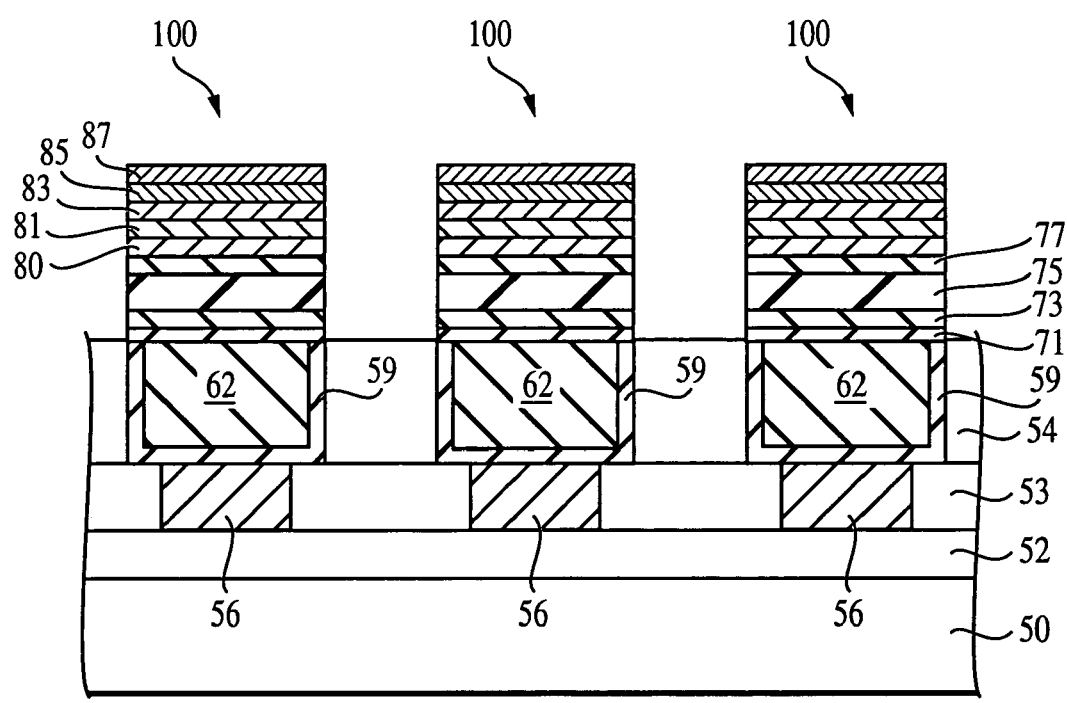
FIG. 16 illustrates a partial cross-sectional view of the magnetic memory element at a stage of processing subsequent to that shown in FIG. 15.
Figure 17:
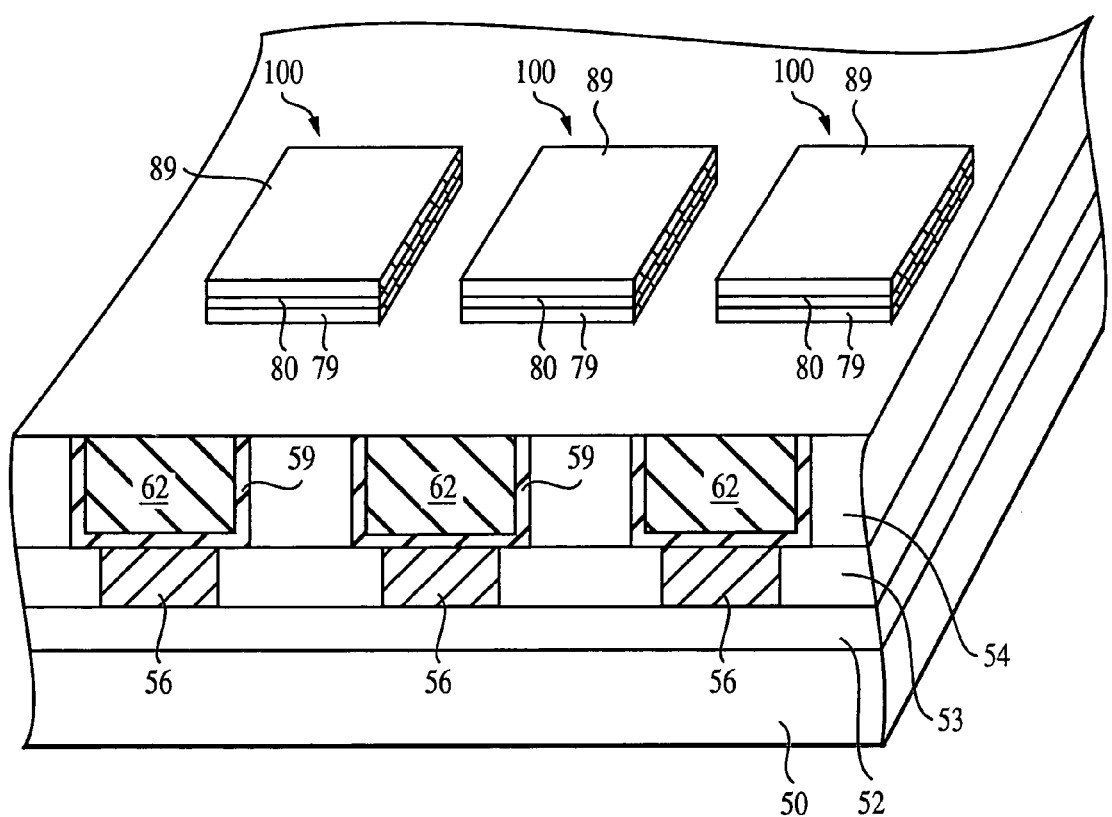
FIG. 17 is a partial three-dimensional view of the magnetic memory element at a stage of processing subsequent to that shown in FIG. 16.

Next, the layers 71, 73, 75, 77, 80, 81, 83, 85 and 87 (FIGS. 13–15) are patterned into a plurality of magnetic memory elements 100 (FIGS. 16–17). Thus, each magnetic memory element 100 includes the pinning structure 79 separated from the sensing structure 89 by the nonmagnetic layer 80. For simplicity, the multilayer stack forming the pinning structure 79 is illustrated in FIG. 17 as a single layer. Similarly, the multilayer stack forming the sensing structure 89 is also illustrated in FIG. 17 as a single layer. It must be understood, however, that the pinning structure 79 includes portions of the copper line 62 and of the layers 71, 73, 75 and 77, while the sensing structure 89 includes portions of the layers 81, 83, 85 and 87.

Patterning of the plurality of layers forming the pinning 79 and sensing 89 structures of the magnetic memory elements 100 (FIG. 17), that is patterning of layers 71, 73, 75, 77, 80, 81, 83, 85 and 87 may be accomplished by ion milling, which typically involves physical sputtering of each layer by an argon ion beam. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also. In any event, the pinning 79 and sensing 89 structures are patterned and etched so that the pinning structure 79 is over and corresponds to the metal lines 62 that form the bottom electrodes of the pinning structure 79.

The invention thus provides a magnetic memory element 100 having a pinning structure 79 formed over the first conductor 62, a nonmagnetic layer 80 formed over the pinning structure 79, and a sensing structure 89 formed over the nonmagnetic layer 80. The sensing structure 89 including antiferromagnetic layer 83, applies a small magnetic bias to the ferromagnetic free layer of the sensing structure 89 without causing the sensing structure to be pinned. The bias allows the sensing structure 89 to be centered near the zero field more easily, thus allowing improved repeatability in switching.

Figure 18:
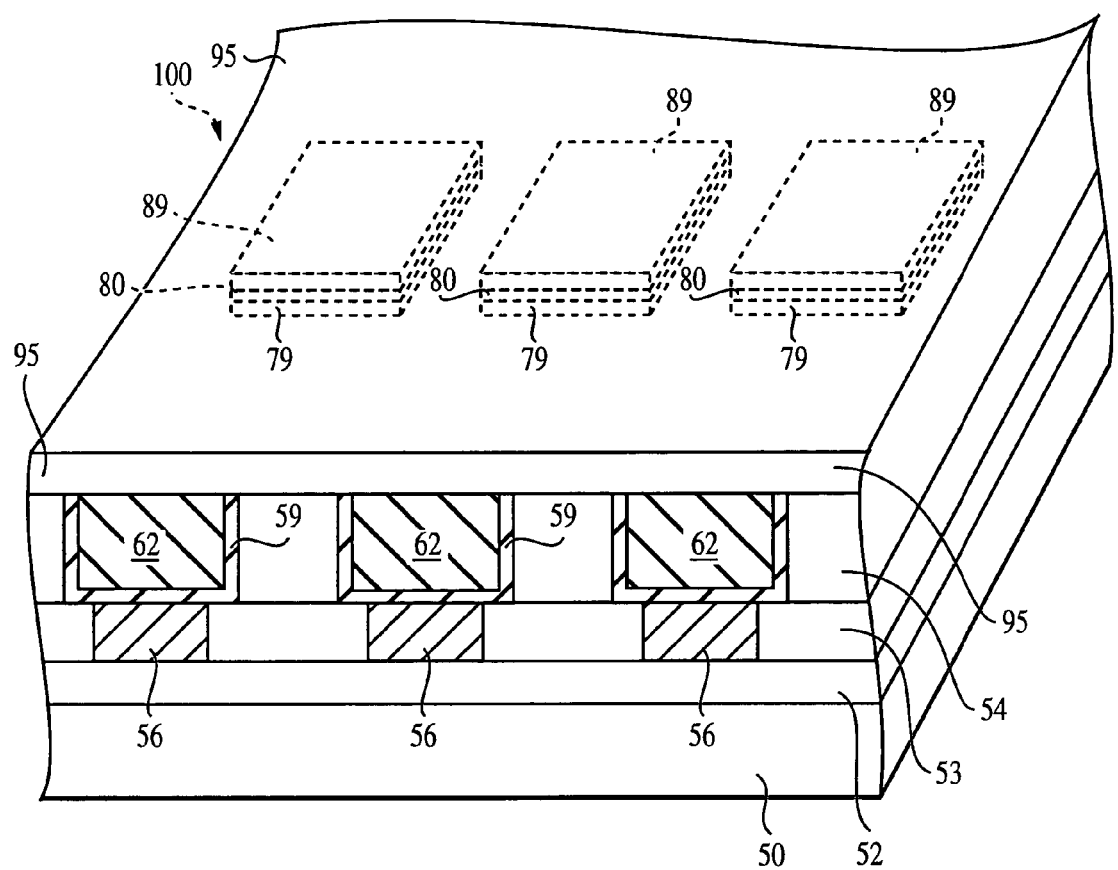
FIG. 18 is a partial three-dimensional view of the magnetic memory element at a stage of processing subsequent to that shown in FIG. 17.

After formation of the memory element 100 (FIG. 17), an insulating layer 95 (FIG. 18) is formed overlying the substrate 50 including the magnetic memory elements 100 to a thickness of about 90–10,000 Angstroms, more preferably of about 5,000 Angstroms. The insulating layer 95 completely fills the spaces between any adjacent magnetic memory elements 100, as shown in FIG. 18. In an exemplary embodiment of the invention, the insulating layer 95 is formed of a nitride material such as silicon-nitride ($Si_3N_4$), which may be formed by conventional deposition methods, such as sputtering by chemical vapor deposition (CVD), plasma enhanced CVD (PECVD), or physical vapor deposition (PVD), among others. However, other conventional insulating materials, for example, BPSG, aluminum oxide, a thermal oxide of silicon, such as SiO or $SiO_2$, or a high temperature polymer, such as a polyimide, a low dielectric constant inorganic material, amorphous dielectric, or bias sputtered quartz may also be employed.

Figure 19:
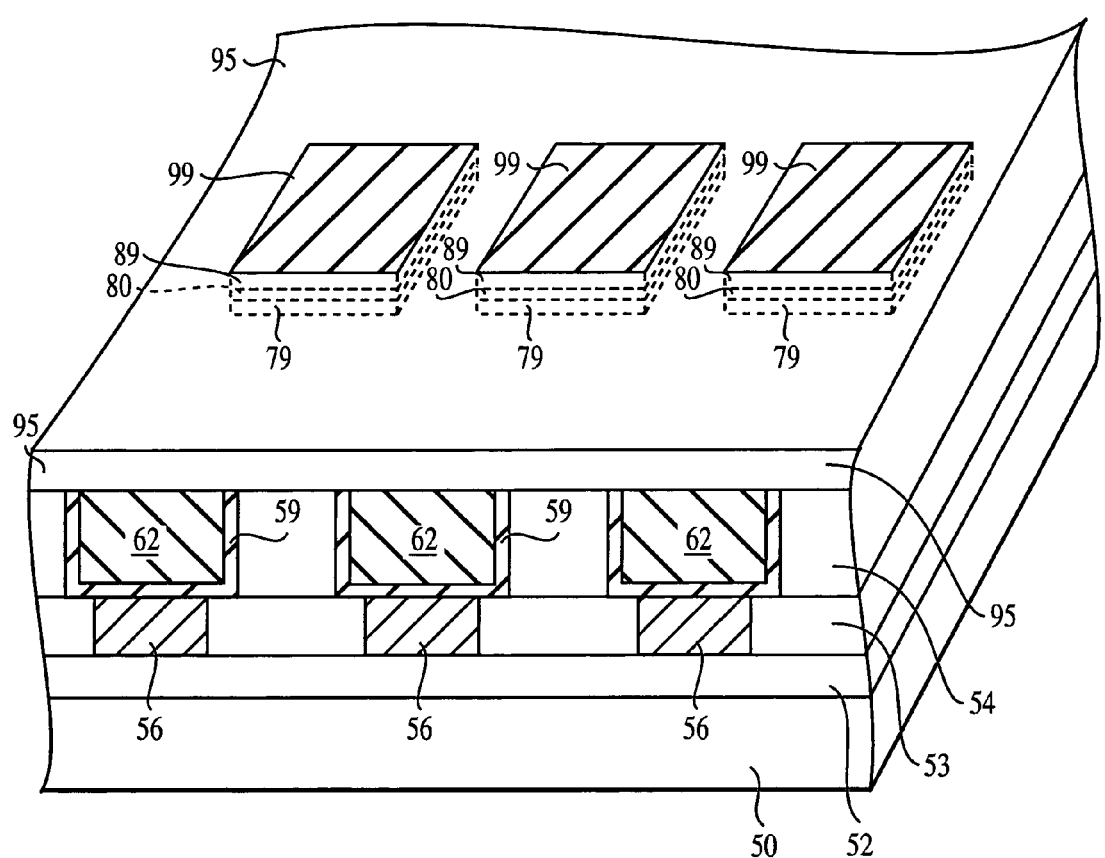
FIG. 19 is a partial three-dimensional view of the magnetic memory element at a stage of processing subsequent to that shown in FIG. 18.

Subsequent to the formation of the insulating layer 95 (FIG. 18), portions of the insulating layer 95 that are formed over the top surface of the magnetic memory elements 100 are removed via CMP or well-known RIE dry etching processes. In an exemplary embodiment of the invention, the insulating layer 95 is planarized using an abrasive polish to remove the top surface of the insulating layer 95 above the magnetic memory elements 100, down to or near the planar surface of the top surface of the conductive layer 87, to form respective MRAM contacts 99 in the insulating layer 95, as illustrated in FIG. 19. This way, the conductive layer 87, which was formed as part of the sensing structure 89 of the magnetic memory element 100, acts as a CMP stop layer in the formation of the contacts 99.

Additional steps to create a functional MRAM device containing the memory elements 100 may be carried out. For example, FIG. 20 illustrates schematically three MRAM element structures 100 coupled to a fabricated word line 93 at respective MRAM contacts 99. As known in the art, the word line 93 may be formed of copper, for example, by patterning a mask on a dielectric layer, which is formed over the sensing structure 89 including the MRAM contacts 99, and by forming a trench in the dielectric layer in which conductive word line 93 is formed in a direction orthogonal to that of the conductors 62. For a better understanding of the invention, the insulating layer 95 has been omitted in FIG. 20 to illustrate the pinning 79 and sensing 89 structures below the word line 93. However, it must be understood that the space between the pinning 79 and sensing 89 structures and below the word line 93 is filled with the insulating layer 95.

Although FIG. 20 illustrates MRAM contacts 99 in direct contact and adjacent to the word line 93, it must be understood that the invention is not limited to this embodiment, and other interceding structures, such as conductive plugs and/or metal lines from the MRAM contacts 99 to the word line 93 may be formed also, as desired.

Figure 21:
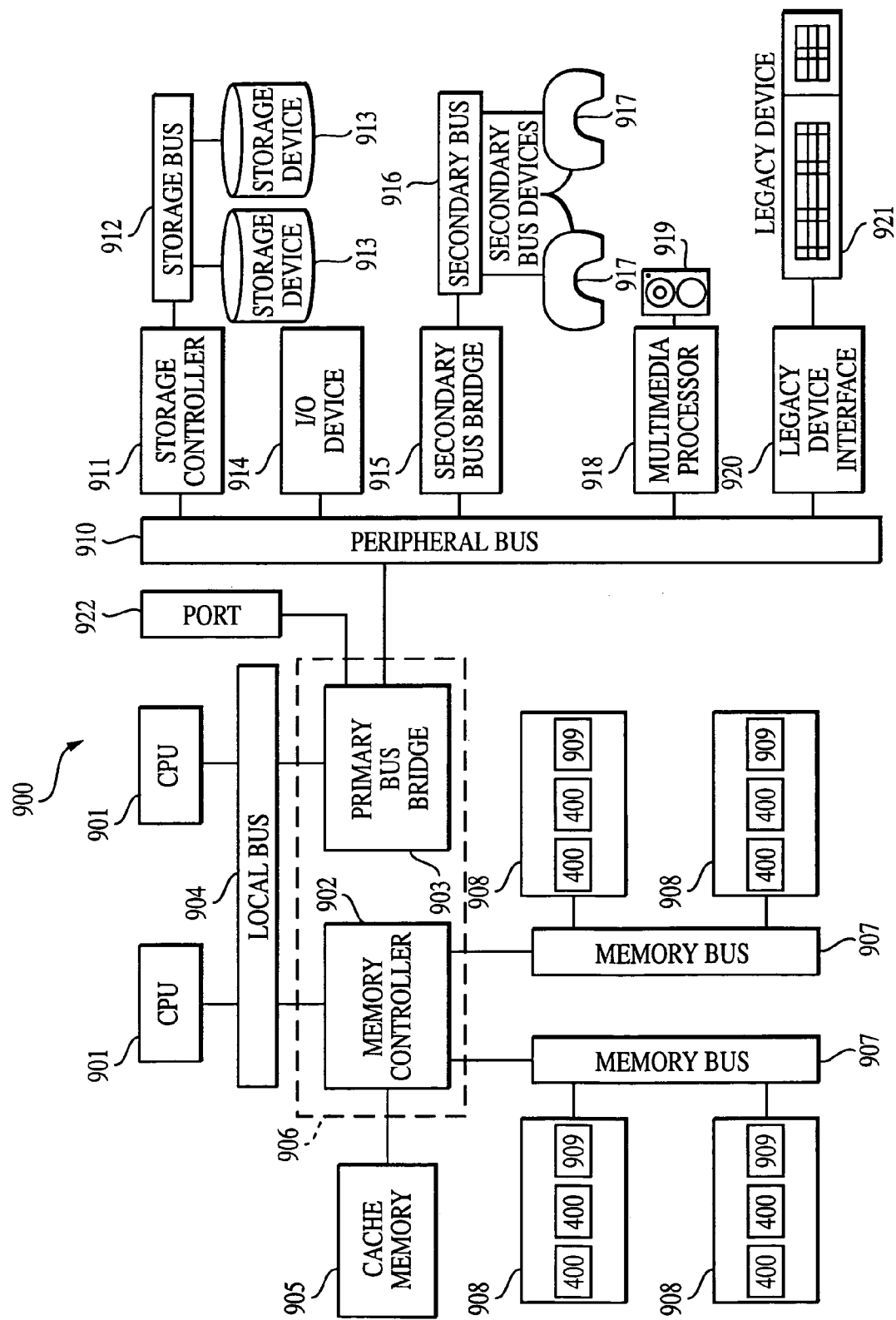
FIG. 21 is a schematic diagram of a processor system incorporating an MRAM constructed in accordance with the invention.

FIG. 21 illustrates an exemplary processing system 900 which may utilize an MRAM memory device 400 which incorporates the memory elements 100 according to the invention as described above with reference to FIGS. 2 through 20. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 400 according to the invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miselementaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 21 is only an exemplary processing system with which the invention may be used. While FIG. 21 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 400. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Although the exemplary embodiments described above illustrate the formation of three magnetic memory elements 100 having respective antiferromagnetic layer 83 (FIGS. 15–16). In addition, although the exemplary embodiments described above refer to a specific topography of the magnetic memory elements with specific magnetic materials forming such structures, it must be understood that the invention is not limited to the above-mentioned magnetic materials, and other magnetic and ferromagnetic materials, such as nickel-iron (Permalloy) or iron, among others, may be used also. Further, although the exemplary embodiments described above refer to patterning of the magnetic memory elements by reactive plasma etching, it must be understood that the invention contemplates the use of other methods of patterning and etching.

The invention is thus not limited to the details of the illustrated embodiment. Accordingly, the above description and drawings are only to be considered illustrative of exemplary embodiments which achieve the features and advantages of the invention. Modifications and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of fabricating a memory element comprising the steps of:
   forming a first pinned magnetic structure over a conductive layer;
   forming a nonmagnetic layer over said first pinned magnetic structure;
   forming a second free magnetic structure over said nonmagnetic layer, wherein said second free magnetic structure comprises an antiferromagnetic layer overlying a ferromagnetic free layer and applying a non-pinning magnetic bias thereto; and
   patterning said first pinned magnetic structure, nonmagnetic layer and second free magnetic structure to form said memory element.

2. The method of claim 1 wherein said antiferromagnetic layer is selected from the group consisting IrMn, FeMn, NiMn, PtMn, NiO, and CoNiO.

3. The method of claim 1 wherein said antiferromagnetic layer includes one or more synthetic layers each having two ferromagnetic layers separated by a metal.

4. The method of claim 1 wherein said antiferromagnetic layer is formed to a thickness of less than about 70 Angstroms.

5. The method of claim 1 wherein said second free magnetic structure comprises a plurality of layers including at least one sense layer.

6. The method of claim 1 wherein said first pinned magnetic structure comprises a plurality of layers including at least one pinned layer.

7. The method of claim 1 wherein said nonmagnetic layer comprises aluminum oxide.

8. The method of claim 1 wherein said bias is applied to said ferromagnetic free layer using said antiferromagnetic layers.

9. The method of claim 8 wherein said bias allows an exchange field between said ferromagnetic free layer and said antiferromagnetic layer to be less than a shape dependent coercivity of said element.

10. A method of fabricating a memory element comprising the steps of:
    forming a first pinned magnetic structure adjacent a conductive layer;
    forming a nonmagnetic layer adjacent said first pinned magnetic structure on a side opposite the conductive layer;
    forming a second free magnetic structure adjacent said nonmagnetic layer on a side opposite the first pinned magnetic structure, wherein said second free magnetic structure comprises an antiferromagnetic layer adjacent a ferromagnetic free layer and applying a non-pinning magnetic bias thereto; and
    patterning said first pinned magnetic structure, nonmagnetic layer and second free magnetic structure to form said memory element.

11. The method of claim 10 wherein said antiferromagnetic layer is selected from the group consisting IrMn, FeMn, NiMn, PtMn, NiO, and CoNiO.

12. The method of claim 10 wherein said antiferromagnetic layer includes one or more synthetic layers each having two ferromagnetic layers separated by a metal.

13. The method of claim 10 wherein said antiferromagnetic layer is formed to a thickness of less than about 70 Angstroms.

14. The method of claim 10 wherein said second free magnetic structure comprises a plurality of layers including at least one sense layer.

15. The method of claim 10 wherein said first pinned magnetic structure comprises a plurality of layers including at least one pinned layer.

16. The method of claim 10 wherein said nonmagnetic layer comprises aluminum oxide.

17. The method of claim 10 wherein said bias is applied to said ferromagnetic free layer using said antiferromagnetic layers.

18. The method of claim 17 wherein said bias allows an exchange field between said ferromagnetic free layer and said antiferromagnetic layer to be less than a shape dependent coercivity of said element.

* * * * *

UNITED STATES PATENT AND TRADEMARK OFFICE
CERTIFICATE OF CORRECTION

PATENT NO. : 7,063,985 B2  
APPLICATION NO. : 10/768678  
DATED : June 20, 2006  
INVENTOR(S) : Joel A. Drewes It is certified that error appears in the above-identified patent and that said Letters Patent is hereby corrected as shown below:

On the Title Page, Item (57),
In the Abstract, line 1, "an magnetic" should read --a magnetic--.

Column 8:

Line 28, "include" should read --includes--;

Line 40, "an legacy" should read --a legacy--;

Line 41, "also coupled" should read --also be coupled--;

Line 52, "an local" should read --a local--;

Line 56, "an universal" should read --a universal--;

Line 57, "via to the" should read --via the--; and

Line 60, "to one additional" should read --to additional--.

Column 9:

Line 11, "system" should read --systems--.

Signed and Sealed this

Seventeenth Day of October, 2006

JON W. DUDAS  
*Director of the United States Patent and Trademark Office*